United States Patent [19]
Hotta

[11] Patent Number: 5,790,466
[45] Date of Patent: Aug. 4, 1998

[54] MULTIPLE PRECHARGING SEMICONDUCTOR MEMORY DEVICE

[76] Inventor: Yasuhiro Hotta, 4-372-3, Minamikyobate-cho, Nara-shi, Nara-ken, Japan

[21] Appl. No.: 757,928

[22] Filed: Nov. 27, 1996

[30] Foreign Application Priority Data

Nov. 28, 1995 [JP] Japan ................ 7-309615

[51] Int. Cl.$^6$ .................. G11C 7/00; G11C 16/06
[52] U.S. Cl. .............. 365/203; 365/204; 365/189.09; 365/185.25
[58] Field of Search .................. 365/203, 189.09, 365/189.11, 204, 185.25, 185.18, 104

[56] References Cited

U.S. PATENT DOCUMENTS

| | | | |
|---|---|---|---|
| 5,058,072 | 10/1991 | Kashimura | 365/203 |
| 5,202,848 | 4/1993 | Nakagawara | 365/104 |
| 5,309,401 | 5/1994 | Suzuki et al. | 365/203 |

FOREIGN PATENT DOCUMENTS

2-12694  1/1990  Japan .
5-28781  2/1993  Japan .

OTHER PUBLICATIONS

Bateman, B.L., "Nonvolatile memories" Session 10 Overview, *1989 IEEE International Solid–State Circuit Conference, Digest of Technical Papers*, pp. 127–132, 134–141.

*Primary Examiner*—David C. Nelms
*Assistant Examiner*—Son Mai

[57] ABSTRACT

The semiconductor memory device of this invention includes a plurality of bit lines for carrying data read out from memory cells and supplying the data to a sense amplifier, the device including: a bias voltage generator for generating a first bias voltage and a second bias voltage which are different from each other; a first precharger for precharging at least one selected bit line to a first precharge voltage obtained based on the first bias voltage generated by the bias voltage generator; and a second precharger for preliminarily precharging each bit line to a second precharge voltage obtained based on the second bias voltage generated by the bias voltage generator.

12 Claims, 5 Drawing Sheets

FIG.1

PRIOR ART

PRIOR ART

MULTIPLE PRECHARGING SEMICONDUCTOR MEMORY DEVICE

BACKGROUND OF THE INVENTION

1. Field of the Invention

The present invention relates to a semiconductor memory device. More specifically, the present invention relates to a semiconductor memory device performing a precharge operation prior to a read/write operation.

2. Description of the Related Art

With the recent speedup of the operation of microprocessors and the like, higher-speed semiconductor memory devices are intensely demanded. To meet this demand, a method of precharging a bit line selected by an external address with high speed via a transistor with high current driving capability has been widely used. Further, a method of preliminarily precharging all bit lines to some level of voltage to further speed the precharging of a selected bit line has also been used.

Figure 1:
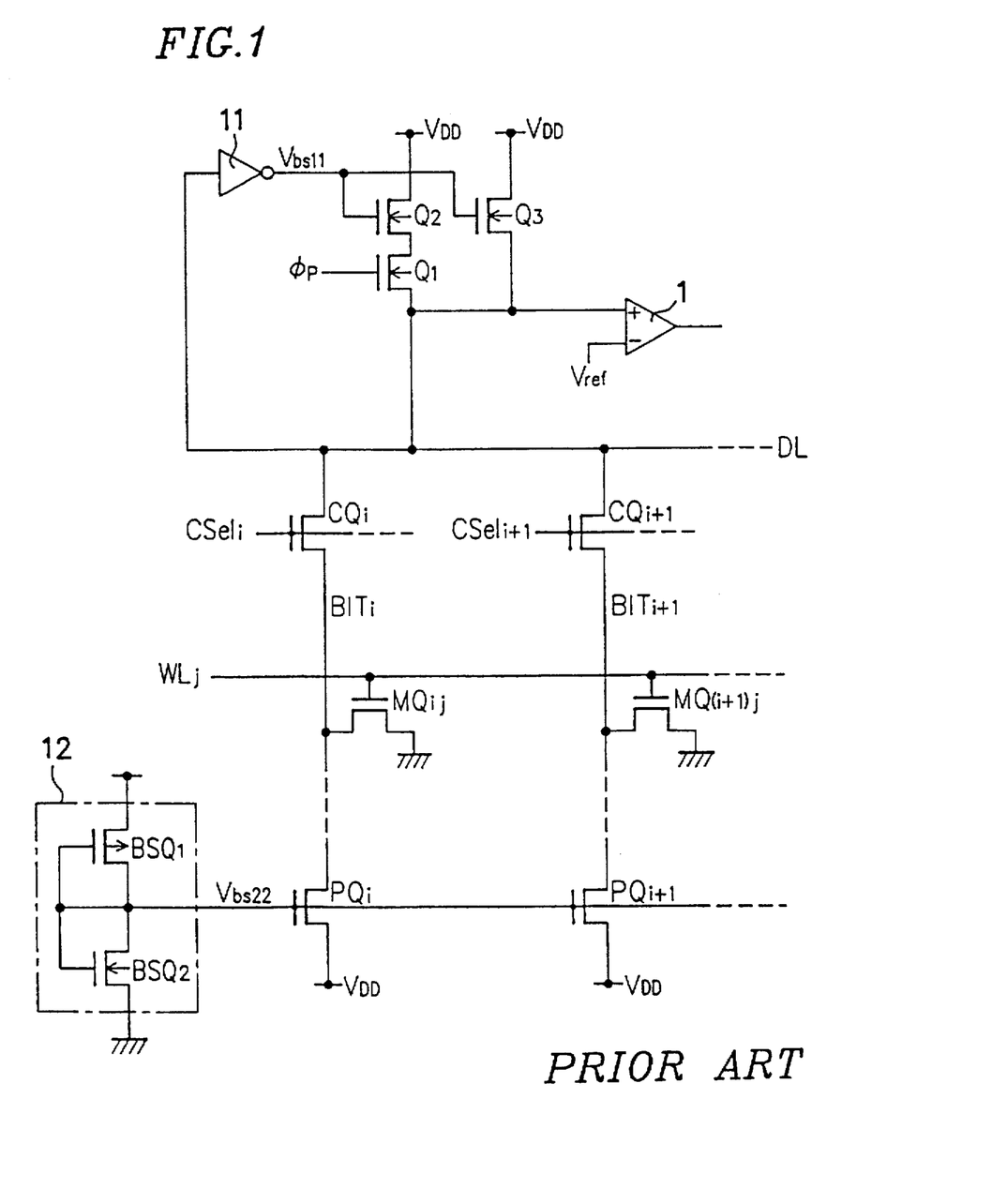
FIG. 1 is a prior art circuit diagram showing the configuration of a conventional mask ROM.

FIG. 1 shows an example of conventional semiconductor memory devices adopting the above latter method. A mask ROM (read only memory) is used as the semiconductor memory device in this example. The mask ROM includes a number of bit lines BIT running in the column direction and a number of word lines WL running in the row direction which cross each other. Each of the word lines WL is connected to the output of a row decoder (not shown). A memory cell MQ composed of a MOSFET is formed in the vicinity of each of the crossings of the bit lines BIT and the word lines WL. The threshold voltage of the memory cell MQ is set at a high voltage when data "1" is stored and at a low voltage when data "0" is stored. In FIG. 1, only two bit lines $BIT_i$ and $BIT_{i+1}$, one word line $WL_j$, and two memory cells $MQ_{ij}$ and $MQ_{(i+1)j}$ are shown for simplification.

One terminal of each bit line BIT is connected to a common data line DL via a corresponding column transistor CQ. The gate of the column transistor CQ is connected to the output of a column decoder (not shown) to receive a column selection signal $CS_{eli}$. The data line DL is connected to the non-inverting input of a sense amplifier 1. The sense amplifier 1 is a differential amplifier which senses data read from the memory cells MQ by amplifying the difference between the potential of the data line DL and a reference voltage $V_{ref}$ input into the inverting input of the sense amplifier 1.

The data line DL is connected to a power source $V_{DD}$ via transistors $Q_1$ and $Q_2$ as well as via a load transistor $Q_3$. The gate of each of the transistors $Q_2$ and $Q_3$ receives a first bias voltage $V_{bs11}$ supplied from an inverter 11 which receives the potential of the data line DL. The gate of the transistor $Q_1$ receives a precharge signal $\phi p$.

The other terminal of each bit line BIT is connected to the power source $V_{DD}$ via a corresponding transistor PQ. The gate of the transistor PQ receives a second bias voltage $V_{bs22}$ supplied from a second bias voltage generating circuit 12. The second bias voltage generating circuit 12 includes a transistor $BSQ_1$ composed of a p-channel MOSFET and a transistor $BSQ_2$ composed of an n-channel MOSFET which are connected in series between the power source $V_{DD}$ and the ground. The gate and the drain of each of the transistors $BSQ_1$ and $BSQ_2$ are short-circuited, to output the second bias voltage $V_{bs22}$ determined by the threshold voltages of the two transistors and the like from the common drain of these transistors.

Figure 2:
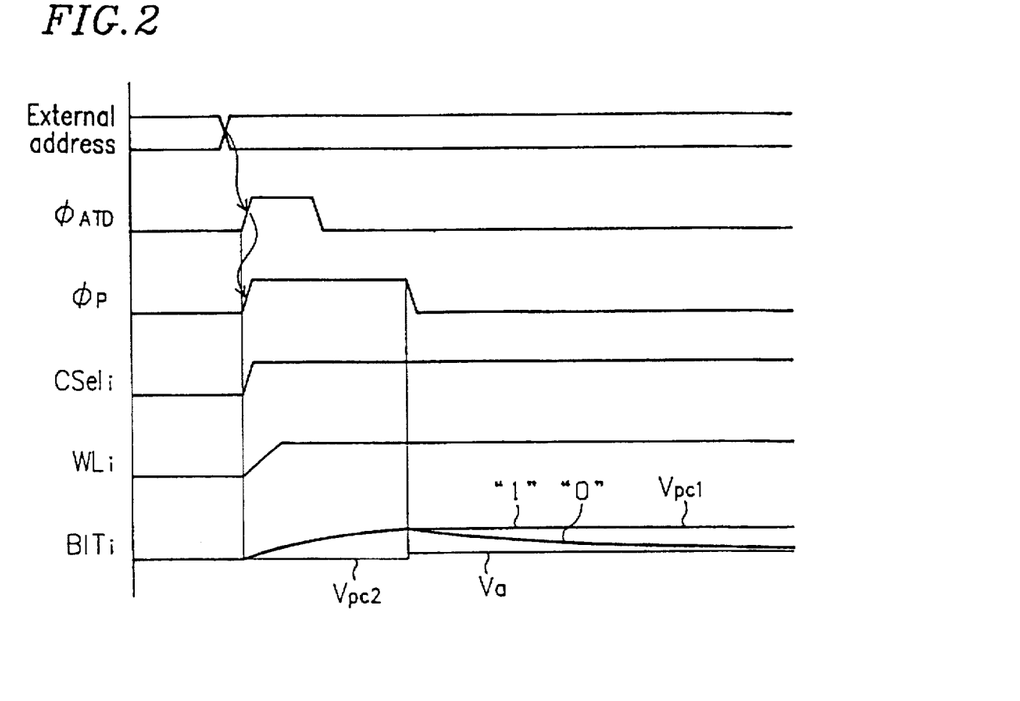
FIG. 2 is a timing chart showing the operation of the conventional mask ROM.

Referring to FIG. 2, the read operation of the mask ROM with the above configuration will be described. The second bias voltage $V_{bs22}$ is input into the gates of the transistors PQ from the second bias voltage generating circuit 12. All the bit lines BIT are therefore kept precharged to a second precharge voltage $V_{pc2}$ based on the second bias voltage $V_{bs22}$. When an external address is determined, an address change detecting circuit (not shown) detects this determination and activates an address change signal $\phi ATD$ (i.e., raises the signal to the high level). The precharge signal $\phi p$ which is activated for a predetermined period is generated by the address change signal $\phi ATD$. This turns on the transistor $Q_1$ during the period when the precharge signal up is active. The determination of the external address also allows the column decoder to activate a column selection signal $CS_{eli}$, turning on a corresponding column transistor $CQ_i$ and thus connecting the bit line $BIT_i$ to the data line DL. As a result, the bit line $BIT_i$ is precharged to a first precharge voltage $V_{pc1}$ based on the first bias voltage $V_{bs11}$ via the transistor $Q_2$.

The determination of the external address further allows the row decoder to activate the word line $WL_j$ to select the memory cell $MQ_{ij}$. When the precharge signal $\phi p$ is inactivated (i.e., lowered to the low level) after the lapse of the predetermined period, the transistor $Q_1$ is turned off to terminate the precharging. In the case where the memory cell $MQ_{ij}$ stores data "1", the memory cell $MQ_{ij}$ is kept off when the word line $WL_j$ is activated because the threshold voltage thereof is high. The bit line $BIT_i$ is therefore kept at the first precharge voltage $V_{pc1}$. On the contrary, in the case where the memory cell $MQ_{ij}$ stores data "0", the memory cell $MQ_{ij}$ is turned on when the word line $WL_j$ is activated, allowing a discharge current to flow from the memory cell $MQ_{ij}$. At this time, when the potential of the bit line $BIT_i$ lowers due to the discharge current, a charge current flows to the bit line $BIT_i$ via the load transistor $Q_3$ of which current driving capability is sufficiently lower than that of the transistor $Q_2$ used for the precharging. As a result, the potential of the bit line $BIT_i$ gradually reduces due to the discharge current from the memory cell $MQ_{ij}$, finally balancing with the charge current from the load transistor $Q_3$ at a voltage $V_a$ which is a little higher than the second precharge voltage $V_{pc2}$.

Thus, data stored in the memory cell $MQ_{ij}$ can be detected by the sense amplifier 1 which senses whether the potential of the bit line $BIT_i$ is kept at the precharge voltage $V_{pc1}$ or has lowered to the voltage $V_a$.

The discharge current from the memory cell $MQ_{ij}$ is balanced with the charge current from the load transistor $Q_3$ after the bit line $BIT_i$ has been swiftly precharged to the first precharge voltage $V_{pc1}$ by the transistor $Q_2$ with high current driving capability. Accordingly, the potential of the bit line $BIT_i$ can be swiftly changed, compared with the case of charging the bit line $BIT_i$ to the first precharge voltage $V_{pc1}$ only by the load transistor $Q_3$ with low current driving capability. Thus, a high-speed read operation can be achieved. Moreover, since all the bit lines BIT have been preliminarily precharged to the second precharge voltage $V_{pc2}$, the time required to further precharge the selected bit line $BIT_i$ to the first precharge voltage $V_{pc1}$ can be reduced. This further facilitates the high-speed read operation.

Figure 3:
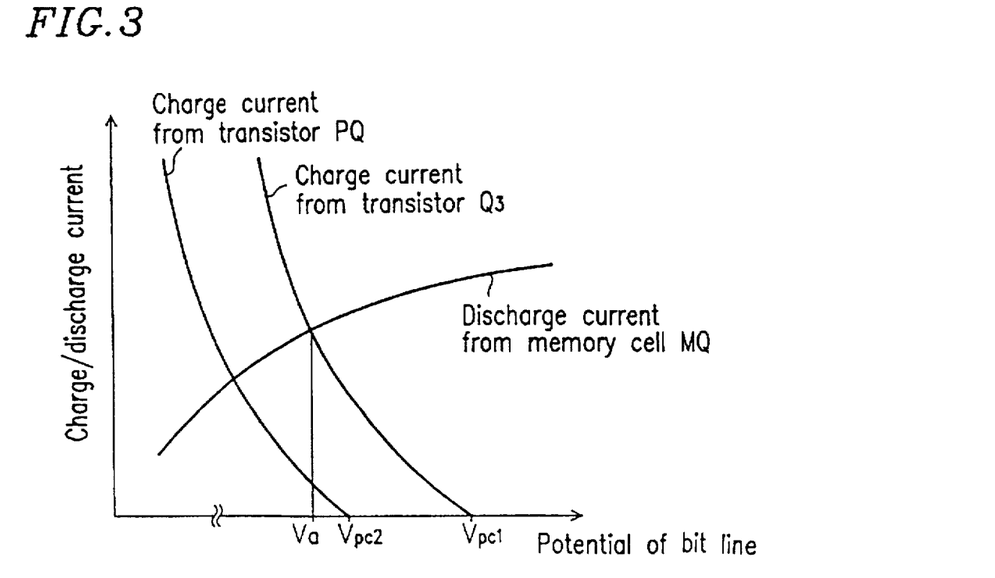
FIG. 3 is a graph showing the characteristics of the charge and discharge currents flowing through a bit line of the conventional mask ROM.

Referring to FIG. 3, the charge currents flowing to the bit line $BIT_i$ via the transistor $PQ_i$ and the load transistor $Q_3$ decrease as the potential of the bit line $BIT_i$ increases, and become 0 when the potential of the bit line $BIT_i$ reaches the second precharge voltage $V_{pc2}$ and the first precharge voltage $V_{pc1}$, respectively. On the contrary, the discharge current flowing from the activated memory cell $MQ_{ij}$ via the bit line $BIT_i$ increases as the potential of the bit line $BIT_i$ increases.

This indicates that, when the memory cell $MQ_{ij}$ is turned on, the charge current from the load transistor $Q_3$ and the discharge current from the memory cell $MQ_{ij}$ are balanced at the crossing of the characteristic curves thereof. The potential of the bit line $BIT_i$ at this balanced state is the voltage $V_a$, which should principally be a little higher than the second precharge voltage $V_{pc2}$ as shown in FIG. 2.

However, when the threshold voltages of the transistors and the width of the bit line $BIT_i$ vary in the semiconductor fabrication process, the first bias voltage $V_{bs11}$ generated by the inverter 11 and the second bias voltage $V_{bs22}$ generated by the second bias voltage generating circuit 12 vary independently from each other. These independent variations result in large variations in the first precharge voltage $V_{pc1}$ and the second precharge voltage $V_{pc2}$ based on the first bias voltage $V_{bs11}$ and the second bias voltage $V_{bs22}$. This may, in some cases, cause the second precharge voltage $V_{pc2}$ to become higher than the voltage $V_a$ as shown in FIG. 3. In such a case, the potential of the bit line $BIT_i$ decreases only to the second precharge voltage $V_{pc2}$ by the charge current flowing to the bit line $BIT_i$ via the transistor $PQ_i$, and does not reach the voltage $V_a$.

As a result, in the conventional semiconductor memory device, if a variation arises in the semiconductor fabrication process, the potential of the bit line $BIT_i$ has only a small amplitude between the first precharge voltage $V_{pc1}$ and the second precharge voltage $V_{pc2}$, and not a sufficiently large amplitude between the first precharge voltage $V_{pc1}$ and the voltage $V_a$. Therefore, the sense amplifier 1 fails in obtaining a sufficiently wide range of voltages where the sense amplifier can normally operate (hereinafter, such a range is referred to as the operation range). In order to secure a sufficiently wide operation range of the sense amplifier 1, the device may be designed so that a sufficiently large potential difference is secured between the first precharge voltage $V_{pc1}$ and the second precharge voltage $V_{pc2}$. In such a case, however, a long charge time is required to raise the potential of the bit line $BIT_i$ which has been preliminarily precharged to the second precharge voltage $V_{pc2}$ up to the first precharge voltage $V_{pc1}$. This prevents the achievement of a high-speed read operation.

Another problem with the conventional semiconductor memory device is that, in order to generate the first bias voltage $V_{bs11}$ and the second bias voltage $V_{bs22}$, individual through currents flow between the power source $V_{DD}$ and the ground for the inverter 11 and the second bias voltage generating circuit 12. This increases power consumption.

SUMMARY OF THE INVENTION

The semiconductor memory device of this invention includes a plurality of bit lines for carrying data readout from memory cells and supplying the data to a sense amplifier, the device including: a bias voltage generator for generating a first bias voltage and a second bias voltage which are different from each other; a first precharger for precharging at least one selected bit line to a first precharge voltage obtained based on the first bias voltage generated by the bias voltage generator; and a second precharger for preliminarily precharging each bit line to a second precharge voltage obtained based on the second bias voltage generated by the bias voltage generator.

In one embodiment of the invention, the bias voltage generator includes a plurality of MOSFETs connected in series between a first and second voltage potential, a gate and a drain of each of at least two of the plurality of MOSFETs being short-circuited, and the first bias voltage and the second bias voltage are output from different nodes of the MOSFETS.

In another embodiment of the invention, the bias voltage generator includes a MOSFET and a plurality of pn-junction diodes which are all connected in series between a first and second voltage potential, a gate and a drain of the MOSFET being short-circuited, and the first bias voltage and the second bias voltage are output from different terminals of the MOSFET and the pn-junction diodes connected in series.

In still another embodiment of the invention, the semiconductor memory device further includes virtual grounding lines which are connected to the bit lines via memory cell transistors and selectively applied with a grounding potential in response to an external address, wherein the first precharger precharges non-selected ones of the virtual grounding lines, as well as the at least one selected bit line, to the first precharge voltage obtained based on the first bias voltage generated by the bias voltage generator, and the second precharger preliminarily precharges the virtual grounding lines, as well as the bit lines, to the second precharge voltage obtained based on the second bias voltage generated by the bias voltage generator.

According to another aspect of the invention, a method of ensuring accurate sensing of data in a memory device is provided. The method includes the steps of: establishing a voltage difference between a first and second precharge voltage, wherein the voltage difference is substantially constant over processing variations; using the first and second precharge voltages to consecutively precharge a data line of the memory device; selecting a memory cell; and sensing the data from the memory cell.

In one embodiment of the invention, the step of establishing a voltage difference between the first and second precharge voltage includes the steps of: forming a string of transistors in series; and taking a first bias voltage from a first node of the transistor string and a second bias voltage from a second node of the transistor string, wherein each of the transistors in the transistor string exhibits substantially the same I-V characteristics and wherein the I-V characteristics of each of the transistors in the transistor string vary in a substantially similar manner over processing variations, thereby establishing a voltage difference between the first and second bias voltages that is substantially constant over the processing variations, and wherein the first and second precharge voltage values are functions of the first and second bias voltages, respectively.

In another embodiment of the invention, the step of establishing a voltage difference between the first and second precharge voltage includes the steps of: forming a string of a transistor and a plurality of diodes in series; and taking a first bias voltage from a first node of the transistor-diode string and a second bias voltage from a second node of the transistor-diode string, wherein each diode in the transistor-diode string exhibits substantially the same I-V characteristics and wherein the I-V characteristics of each of the diodes in the transistor-diode string vary in a substantially similar manner over processing variations, thereby establishing a voltage difference between the first and second bias voltages that is substantially constant over the processing variations, and wherein the first and second precharge voltages are functions of the first and second bias voltages, respectively.

In still another embodiment of the invention, the step of using the first and second precharge voltages to consecutively precharge the data line includes the steps of: applying the second precharge voltage to a plurality of bit lines;

coupling the data line to one of the plurality of bit lines, thereby precharging the data line to the second precharge voltage value; and coupling the first precharge voltage to the data line, thereby precharging the data line to the first precharge voltage value.

Alternatively, the method of reading data from a memory device includes the steps of: providing a first and second bias voltage that vary substantially together over processing variations; applying the second bias voltage to a plurality of bit lines to thereby precharge the plurality of bit lines to a second precharge voltage value, and wherein the second precharge voltage value is a function of the second bias voltage; coupling one of the plurality of bit lines to a data line via a column decoder, thereby precharging the data line to the second precharge voltage value; activating a precharge signal to precharge the data line to a first precharge voltage value, wherein the first precharge value is a function of the first bias voltage; and activating a word line via a row decoder to thereby couple data stored in a memory cell associated with the word line and bit line to a sense amplifier, wherein the first and second precharge voltages vary substantially together over processing variations, thereby maintaining a relative difference between the first and second precharge voltages which is sufficient for the sense amplifier to accurately sense the data at the selected memory cell.

In one embodiment, the step of providing the first and second bias voltage includes the steps of: forming a string of transistors in series; and taking the first bias voltage from a first node of the transistor string and the second bias voltage from a second node of the transistor string, wherein each of the transistors in the transistor string exhibits substantially the same I-V characteristics, and wherein the I-V characteristics of each of the transistors in the transistor string vary in a substantially similar manner over processing variations, thereby establishing a voltage difference between the first and second bias voltages that is substantially constant over the processing variations.

In another embodiment of the invention, the step of establishing a voltage difference between the first and second bias voltage includes the steps of: forming a string of a transistor and a plurality of diodes in series; and taking the first bias voltage from a first node of the transistor-diode string and the second bias voltage from a second node of the transistor-diode string, wherein each diode in the transistor-diode string exhibits substantially the same I-V characteristics, and wherein the I-V characteristics of each of the diodes in the transistor-diode string vary in a substantially similar manner over processing variations, thereby establishing a voltage difference between the first and second bias voltages that is substantially constant over the processing variations.

Thus, the invention described herein makes possible the advantage of providing a semiconductor memory device where some appropriate potential difference is always secured between the first precharge voltage and the second precharge voltage, so that the operation range of the sense amplifier is kept sufficiently wide while the precharge time is reduced.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanying drawings.

(Example 1)

Figure 4:
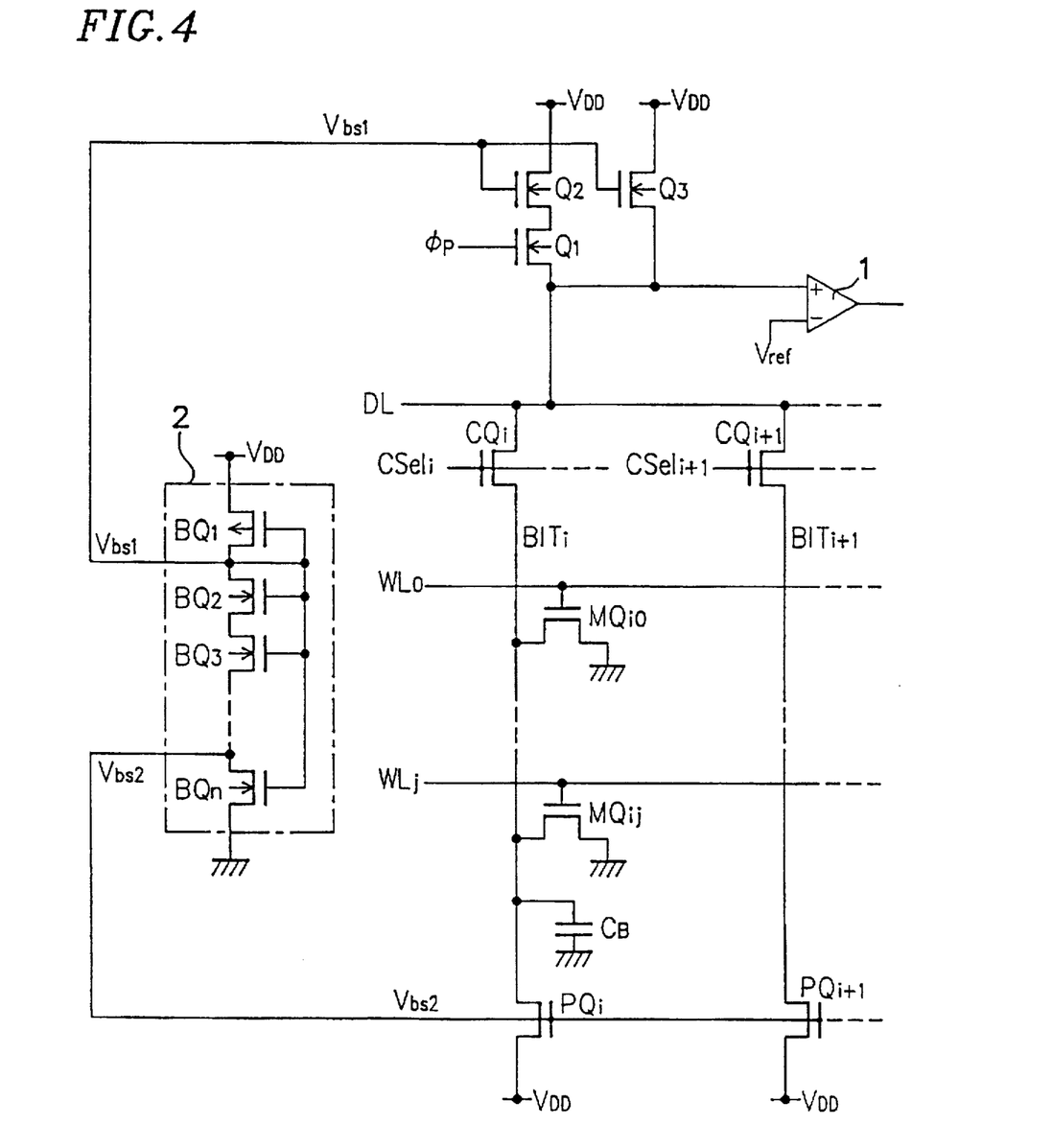
FIG. 4 is a circuit diagram showing the configuration of a mask ROM of Example 1 according to the present invention.
Figure 5:
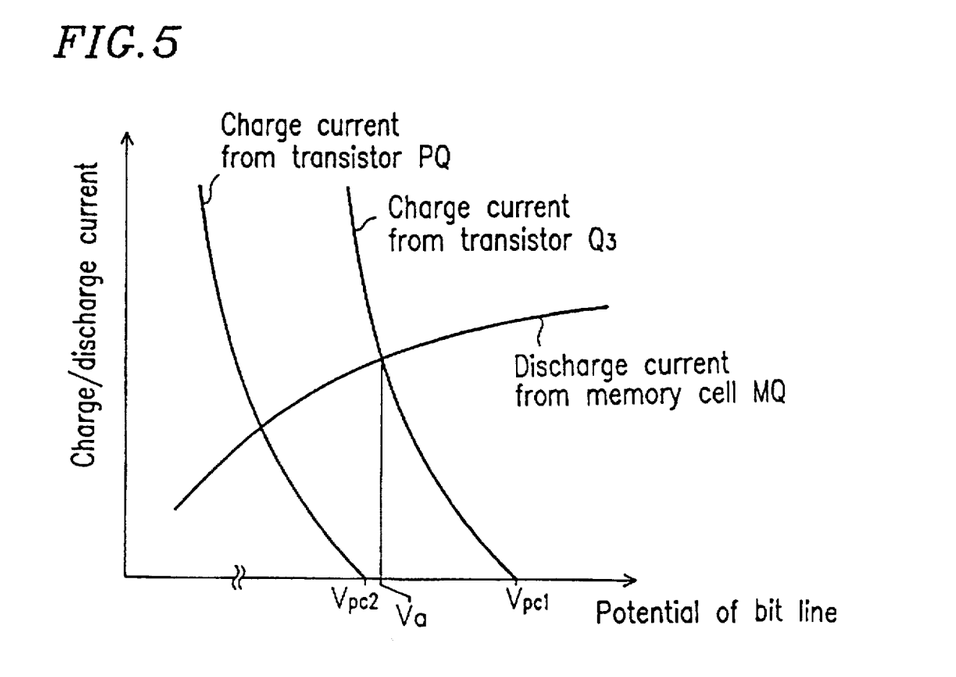
FIG. 5 is a graph showing the characteristics of the charge and discharge currents flowing through a bit line of the mask ROM of Example 1.
Figure 6:
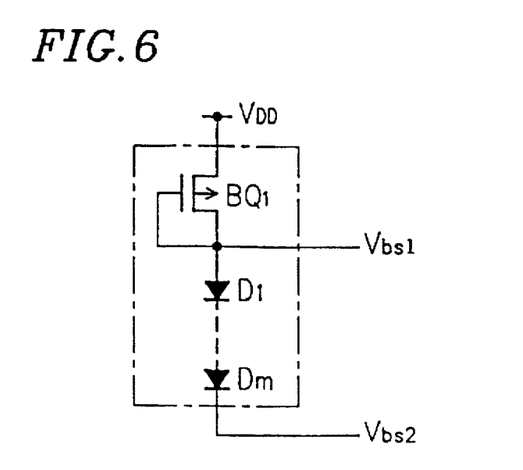
FIG. 6 is a circuit diagram showing an alternative configuration of a bias voltage generating circuit in Example 1.

FIGS. 4 to 6 show a semiconductor memory device of Example 1 according to the present invention. Specifically, FIG. 4 is a circuit diagram showing the configuration of a mask ROM, FIG. 5 is a graph showing the characteristics of the charge and discharge currents flowing through a bit line, and FIG. 6 is a circuit diagram showing an alternative configuration of a bias voltage generating circuit in this example. The components having the same functions as those of the conventional mask ROM shown in FIG. 1 are denoted by the same reference numerals.

In this example, as in the aforementioned conventional example, a mask ROM is used as the semiconductor memory device. The present invention is also applicable to other semiconductor memory devices such as EEPROMs (electrically erasable programmable ROMs).

Referring to FIG. 4, a number of bit lines BIT running in the column direction and a number of word lines WL running in the row direction are arranged to cross each other. A distribution capacitance represented by a capacitance CB with a lumped constant is generated in each bit line BIT due to its running over a long distance. Accordingly, in order to increase the potential of the bit line BIT, the capacitance CB needs to be charged. Each of the word lines WL is connected to the output of a row decoder (not shown). A memory cell MQ composed of a MOSFET is formed in the vicinity of each of the crossings of the bit lines BIT and the word lines WL. The drain of each memory cell MQ is connected to the corresponding bit line BIT, the source thereof is grounded, and the gate thereof is connected to the corresponding word line WL. The memory cell MQ is designed so that the threshold voltage thereof is set at a high voltage when data "1" is stored and at a low voltage when data "0" is stored. In FIG. 4, only two bit lines $BIT_i$ and $BIT_{i+1}$, two word lines $WL_o$ and $WL_j$, and two memory cells $MQ_{io}$ and $MQ_{ij}$ are shown for simplification.

One terminal of each bit line BIT is connected to a common data line DL via a corresponding column transistor CQ. The gate of the column transistor CQ is connected to the output of a column decoder (not shown) so as to receive a column selection signal $CS_{eli}$. The data line DL is connected to the non-inverting input of a sense amplifier 1. The sense amplifier 1 is a differential amplifier which senses data read from the memory cells MQ by amplifying the difference between the potential of the data line DL and a reference voltage $V_{ref}$ input into the inverting input of the sense amplifier 1.

The data line DL is connected to a power source $V_{DD}$ via transistors $Q_1$ and $Q_2$ as well as via a load transistor $Q_3$. The gate of each of the transistors $Q_2$ and $Q_3$ receives a first bias voltage $V_{bs1}$ supplied from a bias voltage generating circuit 2 which will be described later in detail, so that the data line DL connected to the source of these transistors can be charged to a first precharge voltage $V_{pc1}$ which is lower than the first bias voltage $V_{bs1}$ by a value corresponding to the threshold voltage of the transistors. The load transistor $Q_3$ is adjusted in size so that it has an appropriate current driving capability determined in relation with the memory cells MQ. The transistor $Q_2$ is larger in size than the load transistor $Q_3$, and is provided with a sufficiently larger current driving capability. The transistor $Q_1$ receives a logic-level precharge signal $\phi p$ at its gate and is turned on/off in response to the activation/inactivation of the precharge signal $\phi p$.

The other terminal of each bit line BIT is connected to the power source $V_{DD}$ via a corresponding transistor PQ. The gate of the transistor PQ receives a second bias voltage $V_{bs2}$ supplied from the bias voltage generating circuit 2, so that the bit line DL connected to the source of the transistor PQ can be charged to a second precharge voltage $V_{pc2}$ which is lower than the second bias voltage $V_{bs2}$ by a value corresponding to the threshold voltage.

The bias voltage generating circuit 2 includes a transistor $BQ_1$ composed of a p-channel MOSFET and a plurality of transistors $BQ_2$ to $BQ_n$ each composed of an n-channel MOSFET, which are all connected in series between the power source voltage $V_{DD}$ and ground. The gate and the drain of the transistors $BQ_1$ and $BQ_2$ are short-circuited. The first bias voltage $V_{bs1}$ is output from a node connected to respective drains of the transistors $BQ_1$ and $BQ_2$, while the second bias voltage $V_{bs2}$ is output from another node connected to the drain of the transistor $BQ_n$. In such a bias voltage generating circuit 2, the first bias voltage $V_{bs1}$ is higher than the second bias voltage $V_{bs2}$ by a value exceeding the total of the threshold voltages of n-2 transistors $BQ_2$ to $BQ_{n-1}$. This ensures some secure level of voltage difference between the two bias voltages even if a variation arises in the semiconductor fabrication process. Moreover, the values of the first bias voltage $V_{bs1}$ and the second bias voltage $V_{bs2}$ are determined according to the ratio of the threshold voltages of the transistors $BQ_1$ to $BQ_n$. If a variation arises in the semiconductor fabrication process, the threshold voltages of the transistors $BQ_1$ to $BQ_n$ vary with the same tendency. Accordingly, the potential difference between the first bias voltage $V_{bs1}$ and the second bias voltage $V_{bs2}$ does not vary so significantly. The bias voltage generating circuit 2 can be disposed at either end of the bit lines BIT or at any other positions.

The read operation of the mask ROM with the above configuration will now be described. The second bias voltage $V_{bs2}$ is input into the gates of the transistors PQ from the bias voltage generating circuit 2. A charge current therefore flows to all the bit lines BIT until the voltage of the bit lines BIT reaches the second precharge voltage $V_{pc2}$ which is lower than the second bias voltage $V_{bs2}$ by a value corresponding to the threshold voltage of the transistors PQ as shown in FIG. 5. Thus, all the bit lines BIT are kept precharged.

When an external address is determined and a column selection signal $CS_{eli}$ is activated, a column transistor $CQ_i$ is turned on to connect the bit line $BIT_i$ to the data line DL. Upon the determination of the external address, the precharge signal $\phi p$ is activated for a predetermined period, during which time the transistor $Q_1$ is turned on. Since the first bias voltage $V_{bs1}$ is input into the gate of the transistor $Q_2$ from the bias voltage generating circuit 2, the selected bit line $BIT_i$ receives a charge current until the voltage thereof reaches the first precharge voltage $V_{pc1}$, which is lower than the first bias voltage $V_{bs1}$ by a value corresponding to the threshold voltage of the transistor $Q_2$, thereby precharging the bit line $BIT_i$.

Also, when the external address is determined and the word line $WL_j$ is activated, in the case where the memory cell $MQ_{ij}$ stores data "0", the gate voltage of the memory cell $MQ_{ij}$ exceeds the threshold voltage, turning on the memory cell $MQ_{ij}$ and thus allowing a discharge current according to the voltage of the bit line $BIT_1$ to flow from the memory cell $MQ_{ij}$ as shown in FIG. 5. At this time, since the current driving capability of the memory cell $MQ_{ij}$ is sufficiently lower than that of the transistor $Q_2$, the potential of the bit line $BIT_i$ is kept at the first precharge voltage $V_{pc1}$ by the charge current flowing to the bit line $BIT_i$ via the transistors $Q_1$ and $Q_2$ when the precharge signal $\phi p$ is active. When the precharge signal $\phi p$ is inactivated, however, the charge current flows to the bit line $BIT_i$ via the load transistor $Q_3$, which has a low current driving capability. Thus, the discharge current flowing from the memory cell $MQ_{ij}$ exceeds the charge current. This results in gradually lowering the potential of the bit line $BIT_i$. The potential of the bit line $BIT_i$ is then balanced at a voltage $V_a$ where the characteristic of the charge current from the load transistor $Q_3$ and the characteristic of the discharge current from the memory cell $MQ_{ij}$ intersect as shown in FIG. 5.

On the contrary, in the case where the memory cell $MQ_{ij}$ stores data "1", since the threshold voltage of the memory cell $MQ_{ij}$ is high, the memory cell $MQ_{ij}$ is kept off and the potential of the bit line $BIT_i$ is kept at the first precharge voltage $V_{pc1}$ even when the word line $WL_j$ is activated. Thus, the data stored in the memory cell $MQ_{ij}$ can be detected by the sense amplifier 1 which senses whether the potential of the bit line $BIT_i$ is kept at the first precharge voltage $V_{pc1}$ or has lowered to the voltage $V_a$ in the lapse of a predetermined period after the precharge signal $\phi p$ is inactivated.

The potential difference between the first bias voltage $V_{bs1}$ and the second bias voltage $V_{bs2}$ which are generated by the same bias voltage generating circuit 2 relatively with each other does not significantly vary even if a variation arises in the semiconductor fabrication process. The potential difference between the first precharge voltage $V_{pc1}$ and the second precharge voltage $V_{pc2}$ is therefore substantially constant within some limited range. Thus, since some level of difference can be secured between the first precharge voltage $V_{pc1}$ and the second precharge voltage $V_{pc2}$, it is possible to secure a large amplitude of the voltage of the bit lines BIT corresponding to the data stored in the memory cells MQ and a sufficiently wide operation range of the sense amplifier 1.

Conventionally, it takes a long time to further precharge the bit lines BIT which have been preliminarily precharged to the second precharge voltage $V_{pc2}$ to the first precharge voltage $V_{pc1}$ since the potential difference between the first precharge voltage $V_{pc1}$ and the second precharge voltage $V_{pc2}$ is large. This prevents the achievement of high-speed read operation. Such a problem is overcome in this example.

Furthermore, since the first bias voltage $V_{bs1}$ and the second bias voltage $V_{bs2}$ are generated in the same bias voltage generating circuit 2, a through current flowing between the source voltage $V_{DD}$ and ground can be decreased, thereby reducing the power consumption.

Alternatively, as shown in FIG. 6, the bias voltage generating circuit 2 may include the transistor $BQ_1$ composed of a p-channel MOSFET of which gate and drain are short-circuited and a number of pn-junction diodes $D_1$ to $D_n$, which are all connected in series between the power source $V_{DD}$ and ground. In this case, the first bias voltage $V_{bs1}$ is output from a connection terminal of the drain of the transistor $BQ_1$ and the anode of the pn-junction diode $D_1$, while the second bias voltage $V_{bs2}$ is output from the cathode of the pn-junction diode $D_n$. In this case, also, the first bias voltage $V_{bs1}$ is higher than the second bias voltage $V_{bs2}$ by a value exceeding the total of the forward voltages of m pn-junction diodes $D_1$ to $D_n$. This ensures that the potential difference between the first and second bias voltages does not vary so significantly even if a variation arises in the semiconductor fabrication process.

(Example 2)

Figure 7:
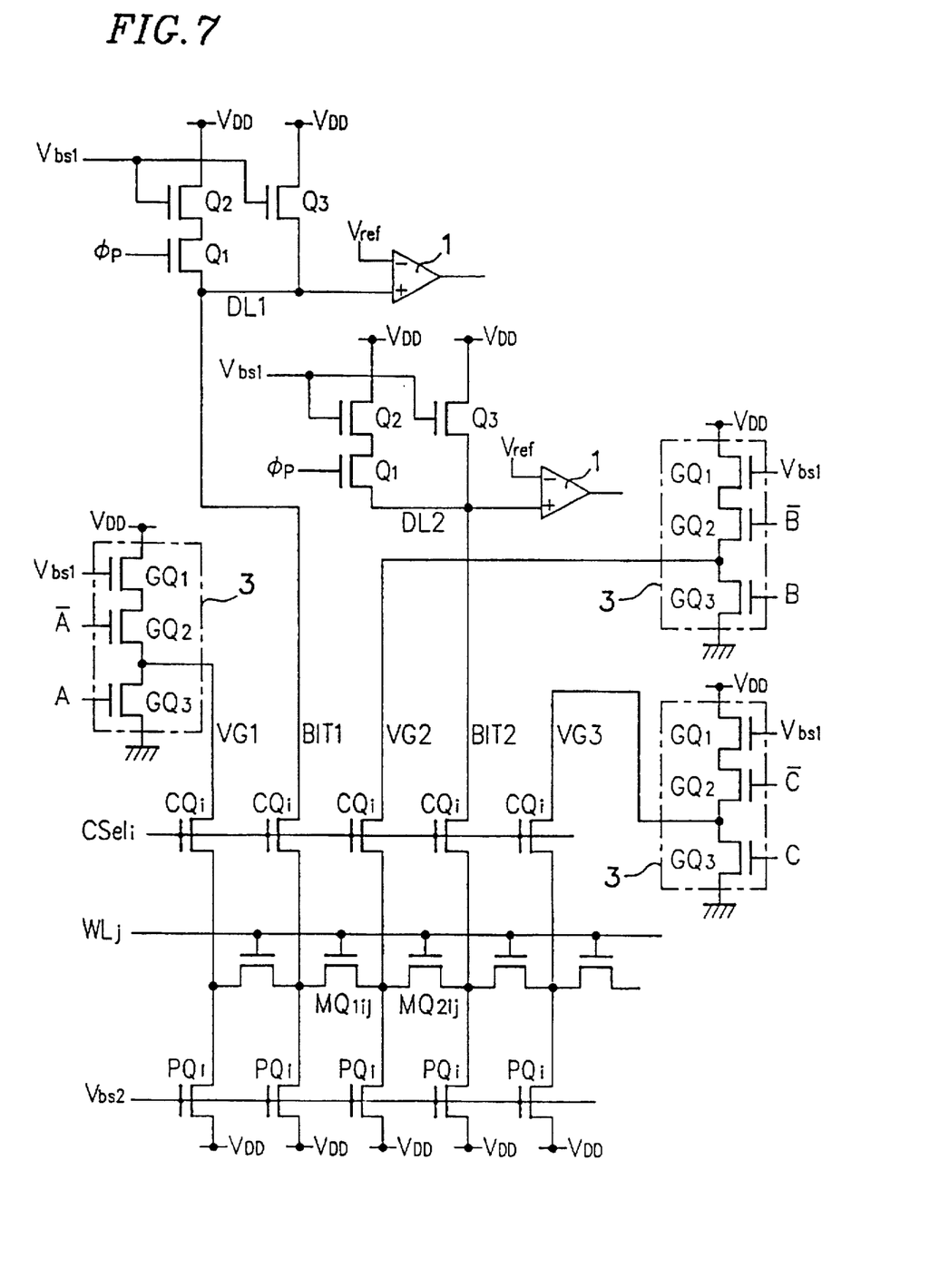
FIG. 7 is a circuit diagram showing the configuration of a mask ROM of Example 2 according to the present invention.

A semiconductor memory device of Example 2 according to the present invention will be described with reference to FIG. 7. FIG. 7 is a circuit diagram showing the configuration of a mask ROM. The components having the same functions as those of the mask ROM of Example 1 shown in FIG. 4 are denoted by the same reference numerals.

In this example, a mask ROM provided with virtual grounding lines VG, which are often used in conventional mask ROMs, is used. In this type of mask ROM, when an external address is determined and one column selection signal $CS_{eli}$ is activated, a plurality of column transistors $CQ_i$ are turned on, selecting a plurality of bit lines $BIT_1$, $BIT_2$, . . . and a plurality of virtual grounding lines $VG_1$, $VG_2$, $VG_3$ . . . . One terminal of each of the bit lines $BIT_1$, $BIT_2$, . . . is connected to a corresponding data line $DL_1$, $DL_2$, . . . via the corresponding column transistor $CQ_i$, and the data read on the data line is sensed by a corresponding sense amplifier 1. Each of the data lines $DL_1$, $DL_2$, . . . is connected to the power source $V_{DD}$ via transistors $Q_1$ and $Q_2$ as well as a load transistor $Q_3$. Accordingly, as in Example 1, the bit lines $BIT_1$, $BIT_2$, . . . can be precharged to the first precharge voltage $V_{pc1}$. The other terminal of each of the bit lines $BIT_1$, $BIT_2$, . . . and the virtual grounding lines $VG_1$, $VG_2$, $VG_3$, . . . is connected to the power source $V_{DD}$ via a corresponding transistor $PQ_1$. Thus, as in Example 1, the bit lines $BIT_1$, $BIT_2$, . . . are kept precharged to the second precharge voltage $V_{pc2}$.

The virtual grounding lines $VG_1$, $VG_2$, $VG_3$, . . . are connected to respective grounding circuits 3 via the respective column transistors $CQ_i$. Each of the grounding circuits 3 includes three transistors $GQ_1$, $GQ_2$, and $GQ_3$ each being an n-channel MOSFET connected together in series. Each of the virtual grounding lines $VG_1$, $VG_2$, $VG_3$, . . . is connected to a connection terminal which is the source of the transistor $GQ_2$ and the drain of the transistor $GQ_3$ of the corresponding grounding circuit 3. The first bias voltage $V_{bs1}$ is input into the gate of the transistor $GQ_1$ of each grounding circuit 3. Selection signals A bar and A are input into the gates of the transistors $GQ_2$ and $GQ_3$ of the grounding circuit 3 connected to the virtual grounding line $VG_1$, respectively. Selection signals B bar and B are input into the gates of the transistors $GQ_2$ and $GQ_3$ of the grounding circuit 3 connected to the virtual grounding line $VG_2$, and selection signals C bar and C are input into the gates of the transistors $GQ_2$ and $GQ_3$ of the grounding circuit 3 connected to the virtual grounding line $VG_3$, respectively. These signals A, B and C, and their compliments are obtained by decoding bits of a portion of the external address.

The first bias voltage $V_{bs1}$ and the second bias voltage $V_{bs2}$ generated by a bias voltage generating circuit (not shown in FIG. 7) which has the same configuration as the bias voltage generating circuit 2 in Example 1 are input into the gates of the transistors $Q_2$ and the load transistors $Q_3$ and the gates of the transistors $PQ_i$, respectively. The first bias voltage $V_{bs1}$ supplied to the gate of the transistor $GQ_1$ of each grounding circuit 3 is generated by the same bias voltage generating circuit.

In the mask ROM with the above configuration, in the case of selecting memory cells $MQ_{1ij}$ and $MQ_{2ij}$, a word line $WL_j$ and the column selection signal $CS_{eli}$ are activated to connect the bit lines $BIT_1$, $BIT_2$, . . . to the data lines $DL_1$, $DL_2$, . . . and connect the virtual grounding lines $VG_1$, $VG_2$, $VG_3$, . . . to the grounding circuits 3. The selection signal B is activated to effectively ground the virtual grounding line $VG_2$ via the transistor $GQ_3$ of the corresponding grounding circuit 3. This allows the memory cells $MQ_{1ij}$ and $MQ_{2ij}$ to conduct discharge currents corresponding to the data stored therein. The data are then detected as in Example 1. On the contrary, the selection signals A, C, . . . are inactivated to allow the virtual grounding lines $VG_1$, $VG_3$, . . . to be charged to the first precharge voltage $V_{pc1}$ via the transistors $GQ_1$ and $GQ_2$ of the respective grounding circuits 3. As a result, no potential difference arises between the source and drain of the other memory cells $MQ_{ij}$, and thus no data read operation is conducted.

Thus, in the mask ROM of this example, as in Example 1, the operation range of the sense amplifier 1 can be sufficiently secured without requiring a long time to precharge the bit lines $BIT_1$, $BIT_2$, . . . . Accordingly, a high-speed and stable read operation can be conducted. Moreover, since the virtual grounding lines $VG_1$, $VG_2$, $VG_3$, . . . can be preliminarily precharged to the second precharge voltage $V_{pc2}$, the charge current required to precharge the non-selected virtual grounding lines $VG_1$, $VG_3$, . . . to the first precharge voltage $V_{pc1}$ can be reduced. Thus, a momentary current generated when the bit lines $BIT_1$, $BIT_2$, . . . and the virtual grounding lines $VG_1$, $VG_3$, . . . are simultaneously precharged can be minimized Thus, according to the present invention, the first precharge voltage and the second precharge voltage for precharging the bit lines are based on the first bias voltage and the second bias voltage generated by the same bias voltage generating circuit. If a variation arises in the transistor characteristics and the like in the semiconductor fabrication process, the first bias voltage and the second bias voltage vary together with this variation. Moreover, these variations in the first and second bias voltages have the tendency because they are generated by the same bias voltage generating circuit. Accordingly, since the values of the first and second bias voltages vary together with the same tendency if a variation arises in the transistor characteristics and the like, the potential difference therebetween does not vary so significantly.

Thus, with such a comparatively small variation in the potential difference between the first bias voltage and the second bias voltage, it is possible to secure some level of difference between the first precharge voltage and the second precharge voltage and thus a sufficiently large amplitude of the voltage of the bit lines. This also solves the conventional problem of requiring a long time to precharge the bit lines which have been preliminarily precharged to the second precharge voltage to the first precharge voltage.

According to the present invention, the threshold voltages of the MOSFETs of the bias voltage generating circuit vary with substantially the same tendency. Accordingly, the potential difference between the first bias voltage and the second bias voltage output from different terminals of these transistors does not vary so significantly.

According to the present invention, the forward voltages of the pn-junction diodes of the bias voltage generating circuit vary with substantially the same tendency. Accordingly, the potential difference between the first bias voltage and the second bias voltage output from different terminals of these diodes does not vary so significantly.

According to the present invention, the virtual grounding lines are preliminarily precharged to the second precharge voltage as in the case of the bit lines. Thus, a momentary current generated when the virtual grounding lines are precharged to the first precharge current can be minimized.

Thus, according to the semiconductor memory device of the present invention, some level of difference can be secured between the first precharge voltage and the second precharge voltage, and thus a sufficiently large amplitude of the voltage of the bit lines can be secured. Accordingly, the sense amplifier can sense data read on the data line with a sufficiently wide operation range. According to the present invention, also, the potential difference between the first precharge voltage and the second precharge voltage does not become so large. This prevents the conventional problem of taking a long time to precharge the bit lines which have been preliminarily precharged to the second precharge voltage to the first precharge voltage. Thus, a high-speed read operation can be achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including a plurality of bit lines for carrying data readout from memory cells and supplying the data to a sense amplifier, the device comprising:

a bias voltage generator for generating a first bias voltage and a second bias voltage which are different from each other;

a first precharger for precharging at least one selected bit line to a first precharge voltage obtained based on the first bias voltage generated by the bias voltage generator; and a second precharger for preliminarily precharging each bit line to a second precharge voltage obtained based on the second bias voltage generated by the bias voltage generator, wherein the first precharger is configured to precharge each bit line from the second precharge voltage to the first precharge voltage.

2. A semiconductor memory device according to claim 1, wherein the bias voltage generator includes a plurality of MOSFETs connected in series between a first and second voltage potential, a gate and a drain of each of at least two of the plurality of MOSFETs being short-circuited, and the first bias voltage and the second bias voltage are output from different nodes of the MOSFETs.

3. A semiconductor memory device according to claim 1, wherein the bias voltage generator includes a MOSFET and a plurality of pn-junction diodes which are all connected in series between a first and second voltage potential, a gate and a drain of the MOSFET being short-circuited, and the first bias voltage and the second bias voltage are output from different terminals of the MOSFET and the pn-junction diodes connected in series.

4. A semiconductor memory device according to claim 1, further comprising virtual grounding lines which are connected to the bit lines via memory cell transistors and selectively applied with a grounding potential in response to an external address, wherein the first precharger precharges non-selected ones of the virtual grounding lines, as well as the at least one selected bit line, to the first precharge voltage obtained based on the first bias voltage generated by the bias voltage generator, and the second precharger preliminarily precharges the virtual grounding lines, as well as the bit lines, to the second precharge voltage obtained based on the second bias voltage generated by the bias voltage generator.

5. A method of ensuring accurate sensing of data in a memory device, comprising the steps of:

establishing a voltage difference between a first and second precharge voltage, wherein the voltage difference is substantially constant over processing variations;

using the first and second precharge voltages to consecutively precharge a data line of the memory device;

selecting a memory cell; and sensing the data from the memory cell.

6. The method of claim 5, wherein the step of establishing a voltage difference between the first and second precharge voltage comprises the steps of:

forming a string of transistors in series; and taking a first bias voltage from a first node of the transistor string and a second bias voltage from a second node of the transistor string, wherein each of the transistors in the transistor string exhibits substantially the same I-V characteristics and wherein the I-V characteristics of each of the transistors in the transistor string vary in a substantially similar manner over processing variations, thereby establishing a voltage difference between the first and second bias voltages that is substantially constant over the processing variations, and wherein the first and second precharge voltage values are functions of the first and second bias voltages, respectively.

7. The method of claim 5, wherein the step of establishing a voltage difference between the first and second precharge voltage comprises the steps of:

forming a string of a transistor and a pluralitiy of diodes in series; and taking a first bias voltage from a first node of the transistor-diode string and a second bias voltage from a second node of the transistor-diode string, wherein each diode in the diode string exhibits substantially the same I-V characteristics and wherein the I-V characteristics of each of the diodes in the transistor-diode string vary in a substantially similar manner over processing variations, thereby establishing a voltage difference between the first and second bias voltages that is substantially constant over the processing variations, and wherein the first and second precharge voltages are functions of the first and second bias voltages, respectively.

8. The method of claim 5, wherein the step of using the first and second precharge voltages to consecutively precharge the data line comprises the steps of:

applying the second precharge voltage to a plurality of bit lines;

coupling the data line to one of the plurality of bit lines, thereby precharging the data line to the second precharge voltage value; and coupling the first precharge voltage to the data line, thereby precharging the data line to the first precharge voltage value.

9. A method of reading data from a memory device, comprising the steps of:

providing a first and second bias voltage that vary substantially together over processing variations;

applying the second bias voltage to a plurality of bit lines to thereby precharge the plurality of bit lines to a second precharge voltage value, and wherein the second precharge voltage value is a function of the second bias voltage;

coupling one of the plurality of bit lines to a data line via a column decoder, thereby precharging the data line to the second precharge voltage value;

activating a precharge signal to precharge the data line to a first precharge voltage value, wherein the first precharge value is a function of the first bias voltage; and activating a word line via a row decoder to thereby couple data stored in a memory cell associated with the word line and bit line to a sense amplifier, wherein the first and second precharge voltages vary substantially together over processing variations, thereby maintaining a relative difference between the first and second precharge voltages which is sufficient for the sense amplifier to accurately sense the data at the selected memory cell.

10. The method of claim 9, wherein the step of providing the first and second bias voltage comprises the steps of:

forming a string of transistors in series; and taking the first bias voltage from a first node of the transistor string and the second bias voltage from a second node of the transistor string, wherein each of the transistors in the transistor string exhibits substantially the same I-V characteristics, and wherein the I-V characteristics of each of the transistors in the transistor string vary in a substantially similar manner over processing variations, thereby establishing a voltage difference between the first and second bias voltages that is substantially constant over the processing variations.

11. The method of claim 9, wherein the step of establishing a voltage difference between the first and second bias voltage comprises the steps of:

forming a string of a transistor and a plurality of diodes in series; and taking the first bias voltage from a first node of the transistor-diode string and the second bias voltage from a second node of the transistor-diode string, wherein each diode in the transistor-diode string exhibits substantially the same I-V characteristics, and wherein the I-V characteristics of each of the diodes in the transistor-diode string vary in a substantially similar manner over processing variations, thereby establishing a voltage difference between the first and second bias voltages that is substantially constant over the processing variations.

12. A semiconductor memory device according to claim 1, wherein the bias voltage generator is configured to generate the first bias voltage and the second bias voltage at the same time.

* * * * *

UNITED STATES PATENT AND TRADEMARK OFFICE
CERTIFICATE OF CORRECTION

PATENT NO. : 5,790,466
DATED : Aug. 4, 1998
INVENTOR(S) : Yasuhiro Hotta

It is certified that error appears in the above-identified patent and that said Letters Patent is hereby corrected as shown below:

On title page, insert item --[73] Assignee: Sharp Kabushiki Kaisha, Osaka, Japan--.

Signed and Sealed this

Twenty-seventh Day of July, 1999

Attest:

Q. TODD DICKINSON

*Attesting Officer*   *Acting Commissioner of Patents and Trademarks*